US012150218B2

(12) United States Patent
Naruse et al.

(10) Patent No.: US 12,150,218 B2
(45) Date of Patent: Nov. 19, 2024

(54) CARBON NANO-TUBE PATTERN WIRING, TRANSPARENT CONDUCTIVE SUBSTRATE, AND HEATER HAVING THE SAME

(71) Applicants: DENSO CORPORATION, Kariya (JP); National University Corporation Tokai National Higher Education and Research System, Nagoya (JP)

(72) Inventors: Junichi Naruse, Kariya (JP); Hisayoshi Oshima, Kariya (JP); Yoshimichi Fujiwara, Kariya (JP); Toshiyuki Takahashi, Kariya (JP); Hidehiko Hiramatsu, Kariya (JP); Keisuke Fugane, Kariya (JP); Yutaka Ohno, Nagoya (JP)

(73) Assignees: DENSO CORPORATION, Kariya (JP); National University Corporation Tokai National Higher Education and Research System, Nagoya (JP)

( * ) Notice: Subject to any disclaimer, the term of this patent is extended or adjusted under 35 U.S.C. 154(b) by 703 days.

(21) Appl. No.: 17/381,828

(22) Filed: Jul. 21, 2021

(65) Prior Publication Data
US 2021/0360745 A1 Nov. 18, 2021

Related U.S. Application Data

(63) Continuation of application No. PCT/JP2020/002134, filed on Jan. 22, 2020.

(30) Foreign Application Priority Data

Jan. 23, 2019 (JP) .................................. 2019-009614

(51) Int. Cl.
*H05B 3/14* (2006.01)
*H05B 3/34* (2006.01)

(52) U.S. Cl.
CPC ............... *H05B 3/145* (2013.01); *H05B 3/34* (2013.01); *H05B 2203/017* (2013.01); *H05B 2214/04* (2013.01)

(58) Field of Classification Search
CPC ................. H05K 1/0274; H05K 1/092; H05K 2201/0108; H05K 2201/09681;
(Continued)

(56) References Cited

U.S. PATENT DOCUMENTS

2008/0171193 A1   7/2008  Yi et al.
2011/0233194 A1*  9/2011  Choi ........................ H05B 3/84
                                                         219/553

(Continued)

FOREIGN PATENT DOCUMENTS

JP   2014-044839 A   3/2014
JP   2014-120353 A   6/2014
JP   2015-146229 A   8/2015

OTHER PUBLICATIONS

Noda, JP 2014044839 (Year: 2014).*
(Continued)

*Primary Examiner* — Vy T Nguyen
(74) *Attorney, Agent, or Firm* — Posz Law Group, PLC (57) ABSTRACT

The wiring includes a substrate having one surface and a CNT pattern having multiple CNT lines which are made of a line-shape CNT on the surface and have a height of 1 μm or more. In the cross section taken along one direction on the one surface, the CNT pattern wiring is a line-and-space film in which the opening is located between the plurality of adjacent CNT lines.

7 Claims, 6 Drawing Sheets

(58) Field of Classification Search
CPC . H05K 2201/09827; H05K 2203/0113; H05K 2203/0502; H05K 3/1275; H05K 3/20; H05K 3/207; H05K 3/386; H05B 2203/013; H05B 3/84
USPC .................................................. 219/552, 553
See application file for complete search history.

(56) References Cited

U.S. PATENT DOCUMENTS

2011/0293850 A1    12/2011  Yi et al.
2017/0199593 A1*    7/2017  Kim .................... G06F 3/041
2017/0285786 A1    10/2017  Hondo

OTHER PUBLICATIONS

Fukaya et al. "One-Step Sub-10 μm Patterning of Carbon-Nanotube Thin Films for Transparent Conductor Applications", ACS Nano vol. 8 No. 4 pp. 3285-3293, 2014.

\* cited by examiner

CARBON NANO-TUBE PATTERN WIRING, TRANSPARENT CONDUCTIVE SUBSTRATE, AND HEATER HAVING THE SAME

CROSS REFERENCE TO RELATED APPLICATION

The present application is a continuation application of International Patent Application No. PCT/JP2020/002134 filed on Jan. 22, 2020, which designated the U.S. and claims the benefit of priority from Japanese Patent Application No. 2019-009614 filed on Jan. 23, 2019. The entire disclosures of all of the above applications are incorporated herein by reference.

TECHNICAL FIELD

The present disclosure relates to carbon nanotube (hereinafter referred to as CNT) pattern wiring, a transparent conductive substrate having the same pattern wiring, and a heater having the same.

BACKGROUND

As a CNT wiring in which a CNT conductive film is formed on a base, for example, a flexible CNT transparent electrode in which a CNT conductive film is formed on a transparent substrate as a base is known. Since the CNT conductive film has a smaller haze value and a smaller change in conductivity with respect to expansion and contraction than the metal mesh conductive film, the CNT transparent electrode is expected to be applied and used for a 3D display panel, a transparent heater, or the like.

SUMMARY

According to an example, the wiring includes a substrate having one surface and a CNT pattern having multiple CNT lines which are made of a line-shape CNT on the surface and have a height of 1 μm or more. In the cross section taken along one direction on the one surface, the CNT pattern wiring is a line-and-space film in which the opening is located between the plurality of adjacent CNT lines.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In recent years, with the micro fabrication of devices, it has been required to reduce the resistance of a CNT wiring. However, since the light transmittance T and the sheet resistance Rs in the CNT wiring are provided by the relationship shown in the following equation using a predetermined constant K, it may be difficult to achieve both high conductivity, that is, low resistance and high light transmittance.

$$T = \exp[-1/(K \times Rs)] \tag{Equation 1}$$

Therefore, it has been studied to pattern the CNT conductive film in the CNT wiring and form the CNT conductive transparent electrode by forming the CNT conductive film in a mesh shape. For example, Non-Patent Literature 1 discloses that a CNT pattern wiring is manufactured by a plurality of ridges. Specifically, a membrane filter is prepared, a mask resist for forming a CNT pattern is placed on or under the membrane filter, and then the gas including CNT is filtered through the mask resist and the membrane filter. As a result, a thin film made of CNT is formed on the membrane filter. Then, the CNT formed on the membrane filter is transferred to the base to form the CNT pattern wiring.

However, in view of a conceivable technique, when the CNT pattern wiring is formed by the above-mentioned manufacturing method, the thickness of the CNT pattern wiring is only about 0.14 μm. With this thickness, the light transmittance can be increased, but the sheet resistance Rs becomes high, for example, 60 to 70 [Ω/□], and low resistance may not be realized.

In view of the above point, a CNT pattern wiring capable of achieving both low resistance and high light transmittance, a transparent conductive substrate having the CNT pattern wiring, and a heater having the same are provided.

The CNT pattern wiring according to one aspect of the present embodiments includes a base having one surface and a CNT pattern having a CNT line which is a line-shaped CNT formed on one surface and having a height of 1 μm or more. In the cross section cut in one direction on the one surface, an opening is located between a plurality of adjacent CNT lines to form a line-and-space-like film.

The CNT pattern wiring having such a configuration has a structure in which a plurality of CNT lines are formed on a base. Then, between CNT lines, a portion formed as an opening without CNT is provided, and a line-and-space-like film in which the CNT line and the opening are alternately arranged is formed. Therefore, it is possible to transmit light through the opening. Further, the height of the CNT line is set to 1 μm or more. Therefore, it is possible to reduce the resistance of the CNT pattern. Therefore, it is possible to provide the CNT pattern wiring that can achieve both low resistance and high light transmittance.

A reference numeral in parentheses attached to each configuration element or the like indicates an example of correspondence between the configuration element or the like and the specific configuration element or the like described in embodiments below.

Hereinafter, embodiments of the present disclosure will be described with reference to the drawings. In each embodiment described below, same or equivalent parts are designated with the same reference numerals.

First Embodiment

The following describes a first embodiment. In this embodiment, the case where the CNT pattern wiring is applied to the heater will be described as an example.

Figure 1:
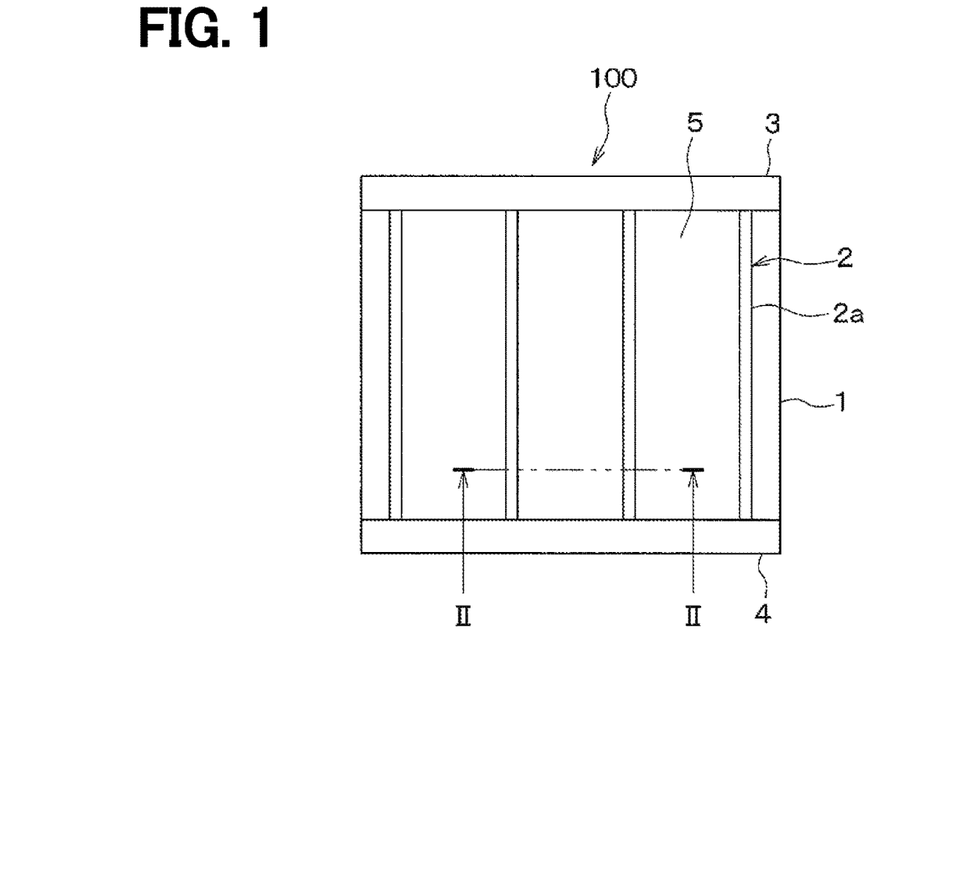
FIG. 1 is a top view of the CNT pattern wiring according to the first embodiment.

As shown in FIG. 1, the CNT pattern wiring 100 is formed by forming the CNT pattern 2 on the substrate 1 and arranging the first electrode 3 and the second electrode 4 at both ends of the CNT pattern 2, respectively.

The substrate 1 is made of a flexible transparent substrate such as a transparent plastic film. Here, as the substrate 1, a transparent substrate that allows light to pass through and can be visually recognized up to the side opposite to the substrate 1 is used. Alternatively, a non-transparent substrate may be used such that the substrate allows one surface of the substrate 1 to be visually recognized.

For example, when it is possible to visually recognize the attachment target of the CNT pattern wiring 100 via the substrate 1 and to make the CNT pattern wiring 100 invisible or inconspicuous, the substrate 1 is made of a transparent substrate. Further, when a part of the mounting target together with the CNT pattern wiring 100 forms the CNT pattern wiring 100 by forming the CNT pattern 2 directly on the mounting target, the substrate 1 may be, for example, a housing as the mounting target. In that case, since one surface of the substrate 1 may be visible, the substrate 1 may be made of a non-transparent material.

Figure 2:
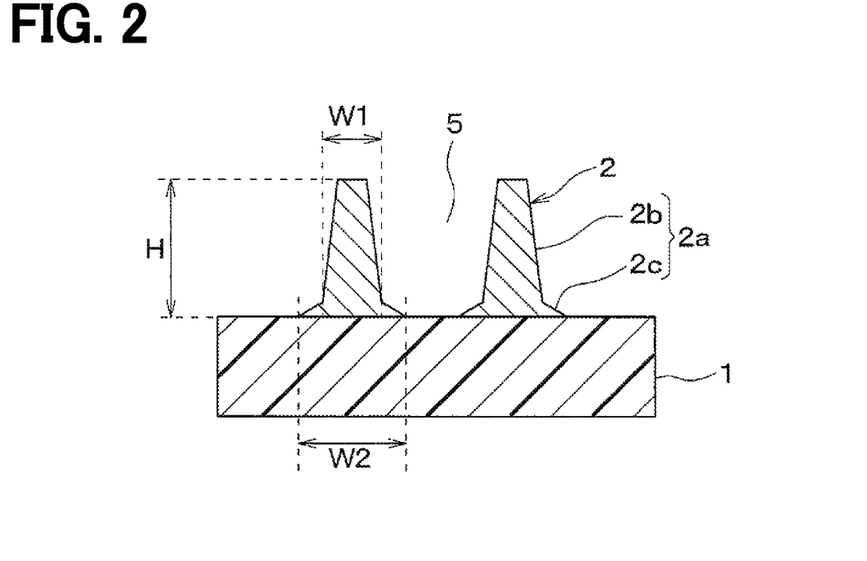
FIG. 2 is a diagram showing a cross-sectional view taken along line II-II of FIG. 1.

The CNT pattern 2 is made of CNT formed in a desired pattern on one surface of the substrate 1. In the case of the present embodiment, the CNT pattern 2 has a striped shape by arranging a plurality of CNT lines 2a at regular intervals as shown in FIG. 1. Further, in the present embodiment, as shown in FIG. 2, each CNT line 2a has a cross-sectional shape which is provided by a base portion 2b with a planar or rod shape having a height direction as the normal direction with respect to the one surface of the substrate 1, and a flange portion 2c protruding from the base portion 2b on the base side. In the case of the present embodiment, the base portion 2b has a first width W1, and the collar portion 2c has a second width W2 that is larger than the widest portion of the first width W1. In FIG. 2, since the first width W1 of the CNT line 2a is shown at a reduced scale, the cross-sectional shape of the CNT line 2a is an inverted T shape. This shape may be changed depending on the first width W1 or the second width and the height H.

The first width W1 is set based on the required sheet resistance and the higher rate, and is set to, for example, 350 μm or less. Specifically, the first width W1 is set to 10 μm or less when the CNT pattern 2 itself is not visible. Alternatively, the first width W1 may be set to, for example, 50 to 100 μm when the CNT pattern 2 itself may be visible. The second width W2 is arbitrary. For example, the ratio between the first width W1 and the second width W2 is 1:1.35. The flange portion 2c of the CNT lines 2a having the second width W2 may not be essential, and all CNT lines 2a may be the base portion 2b of the first width W1. Further, when the structure is provided with the flange portion 2c, the ratio between the first width W1 and the second width W2 described here is merely an example, and other values may be used. Here, by providing the flange portion 2c on the CNT line 2a, the adhesion to the substrate 1 is improved at this portion, and the lateral tilt of the CNT line 2a can be suppressed when the width is narrow. It may be preferable to prepare the flange portion 2c. In particular, when the ratio of the second width W2 to the first width W1 is 1.35 or more as described above, higher adhesion can be obtained.

The width and thickness of the flange portion 2c are arbitrary. They may be set in consideration of the light transmittance. For example, when the second width W2 is large, the area of the portion where the substrate 1 is covered with the flange portion 2c becomes large. When the CNT is thin, high light transmittance can be obtained. On the other hand, the CNT is thick, it cannot be obtained. Therefore, the width and thickness of the flange portion 2c are set in consideration of the light transmittance.

The formation pitch of each CNT line 2a is set so that the portion of the base portion 2b and the portion other than the base portion 2b have a ratio of 1:9. That is, the formation ratio between the area of the substrate 1 where the CNT pattern 2 is formed and the portion where the CNTs are not formed between the bases 2b and the opening 5 is formed is 90%. The formation ratio of the opening 5 may be determined according to the required light transmittance, and when it is 90% or more, a higher light transmittance can be obtained.

Figure 3:
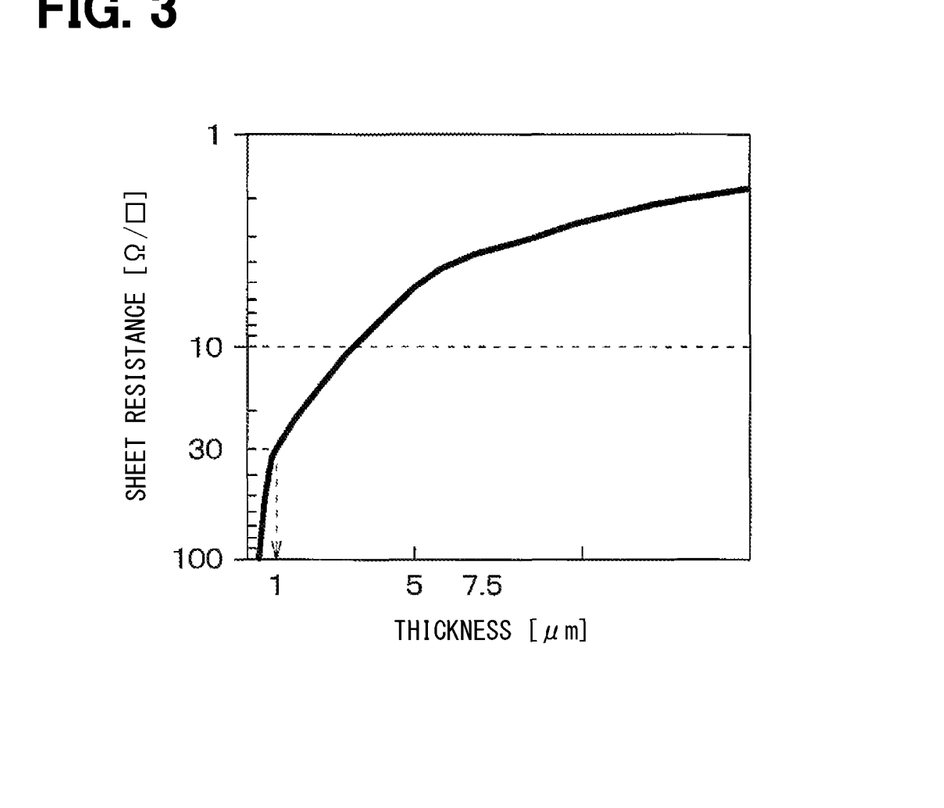
FIG. 3 is a diagram showing the relationship between the thickness of CNTs and sheet resistance.

Further, the height H of each CNT line 2a is equal to each other, and the height from the substrate 1 to the tip is 1 μm or more, may be preferably 5 μm or more. There is a correlation between the height H and the resistance value, and the higher the height H, the lower the resistance. The relationship between the thickness of the CNT, that is, the height H of the CNT line 2a and the sheet resistance [Ω/□] is shown, for example, in FIG. 3. This relationship may differ depending on the film quality such as the type of dopant into CNT, but has the same tendency as in FIG. 3. Since the sheet resistance is 30 [Ω/□] when the height H is 1 μm, it is possible to further reduce the resistance by setting the height H to 1 μm or more. The CNTs for providing the CNT line 2a have a density in the range of 0.1 g/cm$^3$ to 1.1 g/cm$^3$. The orientation of the CNTs providing the CNT line 2a is arbitrary. For example, it can be randomly oriented with respect to the substrate 1.

The first electrode 3 and the second electrode 4 are arranged so as to connect one end side and the other end side of each CNT line 2a, respectively. The first electrode 3 and the second electrode 4 are made of an electrode material such as silver. For example, one is connected to the positive electrode of the power supply and the other is connected to the negative electrode so that a current flows through the CNT pattern wiring 100.

Figure 4:
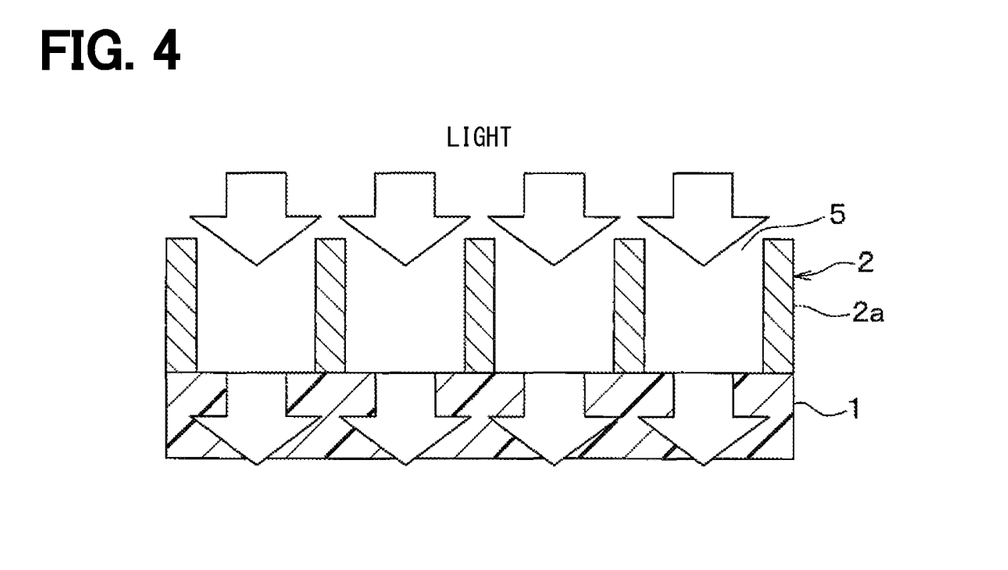
FIG. 4 is a diagram showing a state of light transmission of the CNT pattern wiring.

As described above, the CNT pattern wiring 100 of the present embodiment is configured. The CNT pattern wiring 100 configured in this way has a structure in which the CNT pattern 2 having a plurality of CNT lines 2a is formed on the substrate 1. Then, between the base portions 2b and between the CNT lines 2a, a portion where the CNT is not formed and the opening portion 5 is provided is arranged. Therefore, a line-and-space-like film in which the CNT lines 2a and the openings 5 are alternately arranged is formed. Therefore, as shown in FIG. 4, it is possible to transmit light through the opening 5, and when the formation ratio of the opening 5 is 90% or more, the light transmittance can be as high as 90% or more.

On the other hand, the height H of each CNT line 2a is set to 1 μm or more. Therefore, the sheet resistance can be set to 30 [Ω/□] or less, and the resistance of the CNT pattern 2 can be reduced.

Therefore, it is possible to provide the CNT pattern wiring 100 that can achieve both low resistance and high light transmittance. When the substrate 1 is a transparent substrate, the first width W1 of the base 2b is set to 10 μm or less, so that a transparent conductive substrate having the CNT pattern wiring 100 is provided with both low resistance and high light transmittance achieved at the same time.

Further, the CNT pattern wiring 100 as in the present embodiment can be applied as a heater. Examples of the heater to which the CNT pattern wiring 100 is applied include a heater for performing a defrosting operation in a vehicle air conditioner. In that case, the CNT pattern wiring 100 can be attached to an outdoor unit or the like to which frost adheres so that the wiring 100 functions as a heater. Furthermore, it can be applied to heaters for defrosting and dew condensation prevention such as cameras.

Further, the arrangement of heaters in various places in the vehicle compartment of a vehicle, for example, a foot heater arranged on the lower surface of a dashboard, is expected, and the CNT pattern wiring 100 can be applied as such a heater. When used for such a heater, since the CNT pattern wiring 100 is desired to be inconspicuous, it may be preferable that the substrate 1 is made of a transparent substrate or the substrate 1 is made of a housing to which the heater is attached.

Subsequently, a method of manufacturing the CNT pattern wiring 100 of the present embodiment configured as described above will be described.

Figure 5A:
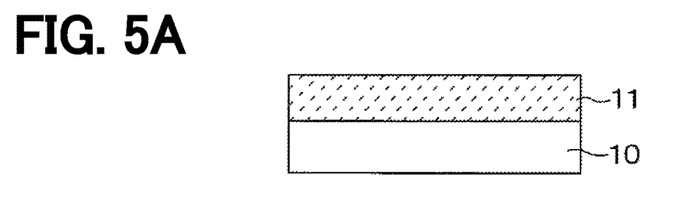
FIG. 5A is a cross-sectional view showing a manufacturing process of the CNT pattern wiring shown in FIGS. 1 and 2.

[Process Shown in FIG. 5A]

First, the filter 10 is prepared. The filter 10 is made of a material capable of filtering CNTs, and is made of, for example, a membrane filter or the like. Then, the resist 11 is arranged on one surface side of the filter 10.

A negative resist is used as the resist 11, and here, a negative resist including an alkali-soluble material is used. The resist 11 is arranged by attaching a thick film resist such as a dry film resist to the filter 10 instead of a general method such as a spin coating. The thickness of the resist 11 is about the same as the height H of the CNT line 2a for providing the CNT pattern 2, that is, 1 μm or more, may be preferably 5 μm or more, for example, 10 μm.

Figure 5B:
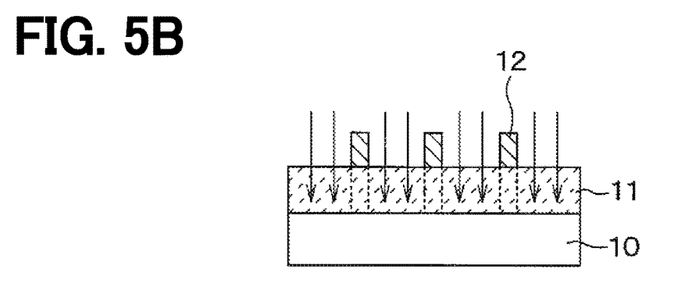
FIG. 5B is a cross-sectional view showing a manufacturing process of the CNT pattern wiring following FIG. 5A.

[Process Shown in FIG. 5B]

For example, the area where the CNT pattern 2 is to be formed is covered with the chrome-based mask 12, and the ultraviolet exposure process is performed over the mask 12. As a result, the exposed portion is solidified.

Figure 5C:
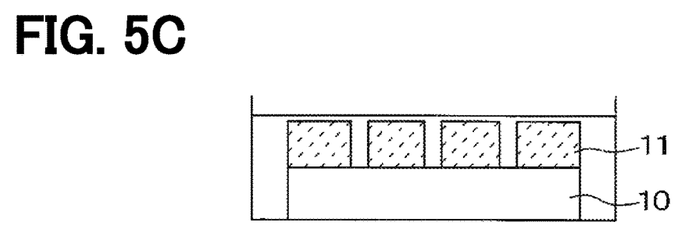
FIG. 5C is a cross-sectional view showing a manufacturing process of the CNT pattern wiring following FIG. 5B.

[Process Shown in FIG. 5C]

The resist 11 and the filter 10 after exposure are developed and rinsed. That is, after removing the mask 12, the exposed resist 11 and the filter 10 are dipped in a rinsing solution such as an aqueous sodium carbonate solution. As a result, the light-shielding portion covered by the mask 12 and not exposed is dissolved, and the groove portion 11a is formed in the region where the CNT pattern 2 is to be formed.

Figure 5D:
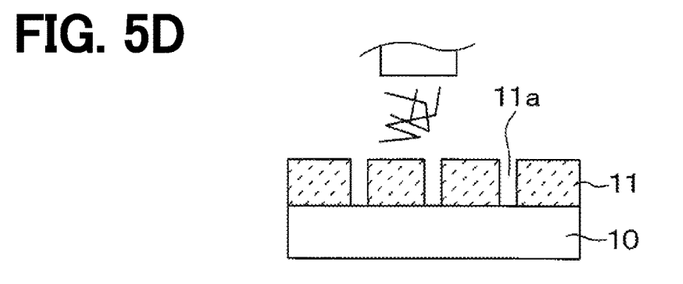
FIG. 5D is a cross-sectional view showing a manufacturing process of the CNT pattern wiring following FIG. 5C.

[Process Shown in FIG. 5D]

The CNT capture process is performed. This process may be carried out using a conventional method. For example, a dispersion medium such as an aerosol as a gas phase dispersion medium including CNT or a colloidal solution as a liquid phase dispersion medium including CNT is prepared, and the dispersion medium is filtered through the filter 10 from the resist 11 side provided with the groove portion 11a. As a result, the CNT included in the dispersion medium is filtered by the filter 10, and the CNT is captured in the groove portion 11a.

Figure 5E:
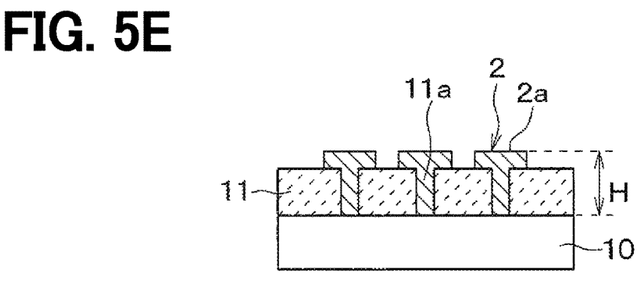
FIG. 5E is a cross-sectional view showing a manufacturing process of the CNT pattern wiring following FIG. 5D.

[Process Shown in FIG. 5E]

When the steps shown in FIG. 5D described above are continuously performed, the CNTs are captured so that the inside of the groove portion 11a is embedded. When these steps are continued, the CNTs are captured so as to protrude to the outside of the groove portion 11a, and a T-shaped CNT pattern 2 is formed. At this time, since the height H of each CNT line 2a constituting the CNT pattern 2 is equal to or higher than the height of the resist 11, the height is set to be 1 μm or more, and here, 10 μm or more.

Figure 5F:
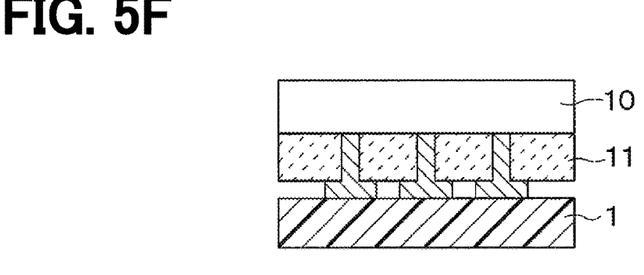
FIG. 5F is a cross-sectional view showing a manufacturing process of the CNT pattern wiring following FIG. 5E.

[Process Shown in FIG. 5F]

A substrate 1 made of a transparent substrate or the like is prepared. Then, the resist 11 and the filter 10 on which the CNT pattern 2 is formed are arranged on one surface side of the substrate 1. At this time, the CNT pattern 2 side, not the filter 10 side, is directed toward one surface side of the substrate 1, so that one end of the CNT pattern 2 is in contact with one surface of the substrate 1.

Figure 5G:
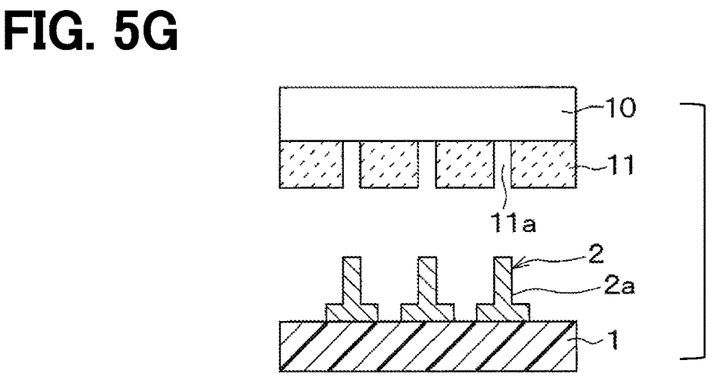
FIG. 5G is a cross-sectional view showing a manufacturing process of CNT pattern wiring following FIG. 5F.

[Process shown in FIG. 5G]

Figure 6:
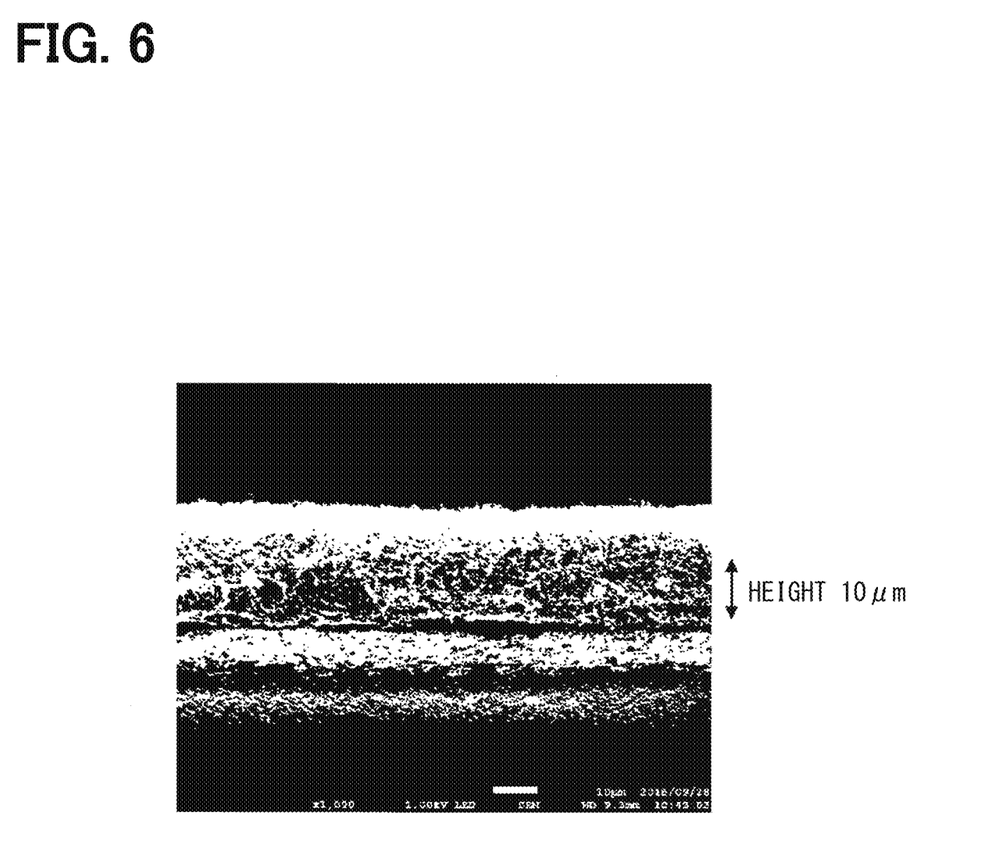
FIG. 6 is a binarized view of an image of a CNT line taken with an electron microscope.

Then, when the filter 10 and the resist 11 are lifted, the CNT pattern 2 is transferred to the substrate 1. As a result, the CNT pattern 2 including the CNT lines 2a having a height H is formed. Here, FIG. 6 shows an image of the sample of the CNT line 2a after formation when it is confirmed with an electron microscope. As can be seen from this image, it can be confirmed that CNTs are deposited. Further, the height of the CNT line 2a is also 10 μm, which is the same as the above-mentioned height. Since FIG. 6 is an image of the CNT line 2a taken from a diagonal angle, the upper surface of the CNT line 2a is also shown, and both the upper surface and the side surface are smooth.

Although the subsequent steps are not shown, the first electrode 3 and the second electrode 4 are formed at both ends of each CNT line 2a in the CNT pattern 2. For example, the first electrode 3 and the second electrode 4 are formed by applying silver or the like as an electrode material to a desired pattern. As a result, the CNT pattern wiring 100 shown in FIG. 1 is completed.

As described above, in the present embodiment, the resist 11 is not formed by spin coating or the like, but is formed of a thick film resist. Therefore, the height H of the CNT line 2a is increased by arranging the groove portion 11a with exposing the resist 11, and capturing the CNT in the groove portion 11a when the CNT is filtered by the filter 10. Therefore, it is possible to obtain the CNT pattern wiring 100 capable of achieving both the low resistance and the high light transmittance described in the present embodiment.

Further, by using a film resist as the resist 11, the resist 11 can be formed by a simple process that does not require spin coating or baking, as compared with the case of forming by conventional coating. Further, as the film resist, a roll-shaped one may be used, and a roll-to-roll method in which the film resist is wound again in a roll-shaped manner after coating may be adopted, so that high mass productivity may be obtained.

Other Embodiments

Although the present disclosure is made with reference to the embodiments described above, the present disclosure is not limited to such embodiments but may include various changes and modifications which are within equivalent ranges. In addition, various combinations and forms, as well as other combinations and forms including only one element, more than that, or less than that, are also within the scope and idea of the present disclosure.

For example, in the above embodiment, the case where the cross-sectional shape of the CNT line 2a is an inverted T-shape as shown in FIG. 2 is applied as an example. Alternatively, other shapes may be used. That is, it is sufficient such that the cross-sectional shape of the CNT line 2a is provided with a planar or rod-shaped base portion 2b whose height direction is the normal direction with respect to one surface of the substrate 1, and the height H of the CNT line 2a at the base portion 2b is 1 µm or more.

Figure 7:
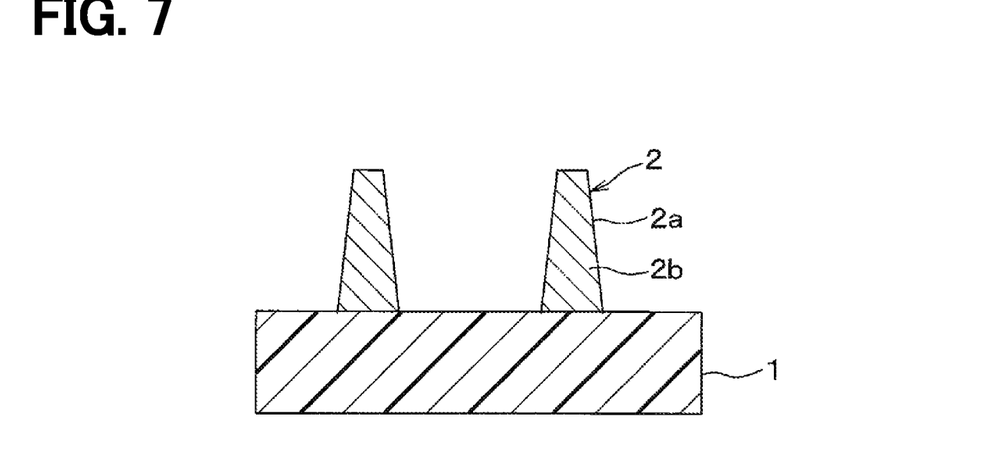
FIG. 7 is a cross-sectional view of the CNT pattern wiring described in another embodiment.
Figure 8:
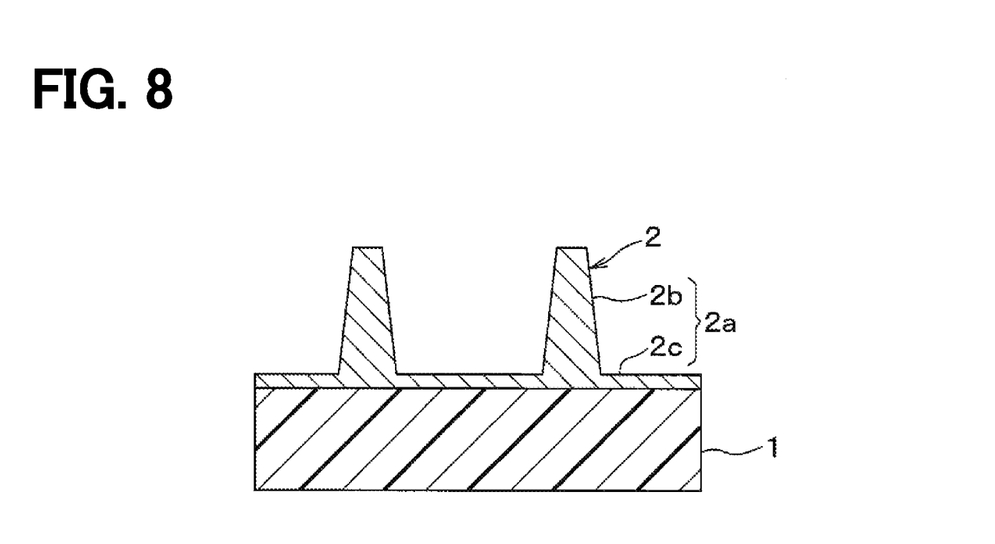
FIG. 8 is a cross-sectional view of the CNT pattern wiring described in another embodiment.

For example, as shown in FIG. 7, each CNT line 2a may be configured only by the base portion 2b. Further, as shown in FIG. 8, the flange portions 2c may be connected to each other in the adjacent CNT lines 2a. In the case of such a structure, the CNT is formed on one surface of the substrate 1 which is the substrate. The thinner the CNT film thickness, the higher the light transmittance, so that the substrate 1 can be visually recognized through the thin flange portion 2c covering the CNT. Therefore, a desired light transmittance can be obtained even when the flange portions 2c are connected between the adjacent CNT lines 2a. Further, even in the case of such a structure, the portion where the CNT is not formed between the base portions 2b is the opening portion 5.

The shape of the CNT line 2a is determined according to the conditions of the CNT capture process. For example, when the dispersion medium is filtered by the filter 10, CNTs are captured in the groove 11a of the resist 11. When the processing time or the like is controlled so that the dispersion medium is captured only in the grooves 11a, the CNT line 2a has a shape of only the base portion 2b as shown in FIG. 7. Further, when the processing time is increased so as to protrude from the groove portion 11a, the CNT line 2a has a shape according to the first embodiment or a shape as shown in FIG. 8.

Further, the first width W1 which is the width of the base portion 2b may be constant, and as shown in FIG. 2, for example, the first width W1 may be tapered so as to be narrower toward the tip. Even in that case, the first width W1 may be 350 µm or less in the widest portion of the base 2b. Alternatively, the width W1 may be 10 µm or less when it is not visible. The second width W2, which is the width of the flange portion 2c, may not always be constant, and may have a structure that becomes wider as it approaches the substrate 1 side, for example.

Further, in the above embodiment, as an example of the line-and-space structure, a structure in which a plurality of linear CNT lines 2a are arranged in a stripe shape has been described. However, these configurations are just examples. That is, the structure may be such that the CNT lines 2a and the openings 5 are alternately arranged on the cross section of the CNT pattern wiring 100 taken along in one direction on one surface of the substrate 1.

For example, the CNT pattern 2 may be configured by laying out the CNT lines 2a in a quadrangular lattice shape on the upper surface, or laying out a plurality of hexagonal shapes in a honeycomb shape.

The width of the first width W1 of the CNT line 2a and the shape of the upper surface of the CNT line 2a are determined by the shape of the groove portion 11a when forming the resist 11. Therefore, the CNT line 2a can be tapered when the width gradually narrows toward the deeper position of the groove 11a, and the CNT line 2a may have that shape when the groove portion 11a has a quadrangular lattice shape or a honeycomb shape.

Further, in the above embodiment, the case where the CNT pattern wiring 100 is applied to the heater has been described as an example. Alternatively, it may also be applied to other things. For example, it is considered that the CNT pattern wiring 100 is attached to a 3D display panel or the like. In that case, for example, the CNT pattern wiring 100 can be applied to the wiring for driving the EL element or the like constituting the 3D display panel. When the CNT pattern wiring 100 is attached to the 3D display panel in this way, it is desired that the underlying 3D display panel can be visually recognized and the CNT pattern wiring 100 cannot be visually recognized. On the other hand, it may be also desired that the CNT pattern wiring 100 has a low resistance. Therefore, it may be preferable that the width of the CNT line 2a is 10 µm or less and the height H is 1 µm or more so that both low resistance and high light transmittance can be achieved at the same time.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A carbon nanotube pattern wiring comprising:
   a substrate having one surface; and
   a CNT pattern having a plurality of carbon nanotube lines which is arranged on the one surface, has a height of 1 µm or more, and is made of a line-shape carbon nanotube, wherein:
   the CNT pattern is a line-and-space film with an opening which is located between the plurality of adjacent carbon nanotube lines in a cross section taken along one direction on the one surface;
   each carbon nanotube line has a base portion which has a height direction perpendicular to the one surface;
   each base portion has a width of 350 µm or less;
   each carbon nanotube line has a flange portion protruding from the base portion on the one surface;
   each base portion has a first width;
   each flange portion has a second width;
   a ratio between the second width and the first width is 1.35 or more;
   a part of the substrate between the flange portions is exposed from the CNT pattern; and
   a sheet resistance of the CNT pattern is 30Ω/□ or less.

2. The carbon nanotube pattern wiring according to claim 1, wherein:
   the carbon nanotube providing the carbon nanotube lines is arranged in a state of being randomly oriented with respect to the substrate.

3. The carbon nanotube pattern wiring according to claim 1, wherein:
   a density of the carbon nanotube is in a range between 0.1 g/cm$^3$ and 1.1 g/cm$^3$.

4. The carbon nanotube pattern wiring according to claim 1, wherein:
   the height of each carbon nanotube line is 5 µm or more.

5. The carbon nanotube pattern wiring according to claim 1, wherein:
   the flange portions of adjacent carbon nanotube lines are connected to each other.

6. A transparent conductive substrate comprising:
the carbon nanotube pattern wiring according to claim 1, wherein:
the substrate is made of a transparent substrate; and
the base portion has a width of 10 μm or less.

7. A heater comprising:
the carbon nanotube pattern wiring according to claim 1.

* * * * *